(12) United States Patent
Cha et al.

(10) Patent No.: US 11,491,549 B2
(45) Date of Patent: Nov. 8, 2022

(54) MULTI-LAYER COATED CUTTING MATERIAL, METHOD FOR MANUFACTURING THE SAME, AND CUTTING TOOL INSERT FOR MECHANICAL MACHINING INCLUDING THE SAME

(71) Applicant: YG-1 Co., Ltd., Incheon (KR)

(72) Inventors: Soo Hyun Cha, Chungcheongbuk-do (KR); Geun Woo Park, Chungcheongbuk-do (KR); Sang Young Jo, Chungcheongbuk-do (KR)

(73) Assignee: YG-1 CO., LTD., Incheon (KR)

( * ) Notice: Subject to any disclaimer, the term of this patent is extended or adjusted under 35 U.S.C. 154(b) by 30 days.

(21) Appl. No.: 17/212,126

(22) Filed: Mar. 25, 2021

(65) Prior Publication Data
US 2022/0055116 A1 Feb. 24, 2022

(30) Foreign Application Priority Data

Aug. 24, 2020 (KR) .................. 10-2020-0106054

(51) Int. Cl.
*B23B 27/14* (2006.01)
*B23C 5/16* (2006.01)
*C23C 28/00* (2006.01)
*C23C 28/04* (2006.01)

(52) U.S. Cl.
CPC ............ *B23B 27/148* (2013.01); *B23B 27/14* (2013.01); *B23C 5/16* (2013.01); *C23C 28/044* (2013.01); *C23C 28/42* (2013.01); *C23C 28/44* (2013.01); *B23B 2222/84* (2013.01); *B23B 2224/24* (2013.01); *B23B 2224/28* (2013.01); *B23B 2224/32* (2013.01); *B23B 2224/36* (2013.01); *B23B 2228/105* (2013.01)

(58) Field of Classification Search
CPC ... B23B 27/14; B23B 27/148; B23B 2224/24; B23B 2228/105; B23C 5/16; C23C 14/325; C23C 14/0641; C23C 14/0664; C23C 28/42; C23C 28/44
USPC .......................................................... 428/697
See application file for complete search history.

(56) References Cited

U.S. PATENT DOCUMENTS

| 2009/0226273 A1* | 9/2009 | Johansson ............ C23C 14/0641 409/132 |
| 2012/0114436 A1* | 5/2012 | Andersson ............ C04B 41/009 407/119 |
| 2015/0232978 A1* | 8/2015 | Schier ................... C23C 30/005 428/141 |
| 2017/0266733 A1* | 9/2017 | Sato ...................... C23C 14/325 |

FOREIGN PATENT DOCUMENTS

KR 1020120015338 2/2012

* cited by examiner

*Primary Examiner* — Archene A Turner
(74) *Attorney, Agent, or Firm* — Stuart H. Mayer; Mayer & Williams PC (57) ABSTRACT

The present disclosure provides a multilayer coated cutting material having increased wear resistance at high temperatures, a method for manufacturing the same, and a cutting tool insert for mechanical machining including the same. According to an embodiment of the present disclosure, the multilayer coated cutting material includes a cemented carbide, cermet, ceramic, a cubic crystal boron nitride-based material or a hard alloy body of high-speed steel, and a cutting layer positioned on the base material and configured in multiple layers.

16 Claims, 6 Drawing Sheets

MULTI-LAYER COATED CUTTING MATERIAL, METHOD FOR MANUFACTURING THE SAME, AND CUTTING TOOL INSERT FOR MECHANICAL MACHINING INCLUDING THE SAME

CROSS-REFERENCE TO RELATED APPLICATION

This application claims the benefit of Korean Patent Application No. 10-2020-0106054 filed on Aug. 24, 2020, the disclosure of which is incorporated by reference herein in its entirety.

BACKGROUND

The present disclosure relates to a cutting tool material, and more particularly, to a multilayer coated cutting material, a method for manufacturing the same, and a cutting tool insert for mechanical machining including the same.

For applications requiring special mechanical and chemical characteristics at high temperatures, stainless steel, heat-resistant alloys, and the like have been developed and used in many industrial fields to manufacture core components. Accordingly, continuous development of cutting tools for machining these components have been demanded to improve the machinability. Recently due to revolutionary advancement and development of new materials surpassing conventional stainless steel, heat-resistant alloys, or the like, it becomes difficult to machine an alloy material using conventional tools, and thus, high level of characteristics are being demanded to cutting tools.

Due to an increase in machining speed and properties of workpiece materials including various characteristics, the temperatures of the blades of cutting tools increase, wear and deterioration in the cutting tool are accelerated, and thus, the materials for the cutting tools are required to have more excellent characteristics. Coating stability, that is, oxidation resistance and wear resistance at high temperatures appear as the required characteristics of cutting tools, and there is a limitation in the oxidation resistance and wear resistance of AlTiN which is a material for a conventional cutting tool.

AlTiN which is a nitride containing aluminum (Al) and titanium (Ti) may simultaneously ensure oxidation resistance and wear resistance by further being provided with characteristics of aluminum (Al) in addition to high hardness, and thus has been widely used as a coating material for cemented carbides and various metal cutting tools after 1990s. However, as described above, according to continuous development of materials for workpiece materials, the AlTiN confronts with a limitation of lacking characteristics to be used for machining materials for aviation industry or machining at high temperatures. In order to overcome such limitation, the lifespan of tools is improved by maintaining hardness at high temperatures and manufacturing materials for cutting tools having high hardness.

In order to reinforce thermal stability and oxidation resistance aside from such requirements of wear resistance, the characteristics of an AlTiN thin film are reinforced by introducing additional elements to the TiN-based coating and the TiAlN-based coating, and furthermore a multi-component-based, such as bi-component-based or tri-component-based, compound thin film is being developed which contains elements such as Si, W, Cr and Mo. In addition, efforts have been continued to increase the lifespan of cutting tools by improving the characteristics of thin films through a method of using various coating structures.

PRIOR ART DOCUMENT

Patent Document (Patent document 1) Korean Patent Application No. 10-2011-7028852

SUMMARY

The present disclosure provides a multilayer coated cutting material having increased wear resistance at high temperatures, a method for manufacturing the same, and a cutting tool insert for mechanical machining, including the same.

However, the foregoing purpose is merely exemplary, and the technical scope of the present disclosure is not limited thereto.

In accordance with an embodiment, there are provided a multilayer coated cutting material having increased wear resistance at high temperatures and a cutting tool insert for mechanical machining including the same.

In accordance with an embodiment, the multilayer coated cutting material includes: a base material including a cemented carbide, cermet, ceramic, a cubic crystal boron nitride-based material or a hard alloy body of high-speed steel; and a cutting layer positioned on the base material and configured in multiple layers, wherein the cutting layer includes: a first cutting layer positioned on the base material and including $(Ti_{1-a-b}Al_aM_b)X$ (where, $0.3<a<0.7$, $0<b<0.3$, and M includes at least one selected from the group consisting of silicon (Si), zirconium (Zr), yttrium (Y), vanadium (V), niobium (Nb), molybdenum (Mo), and tungsten (W), and X includes at least one selected from the group consisting of N, C, CN, NO, CO, and CNO); a second cutting layer positioned on the first cutting layer and including $(Ti_dSi_{1-d})X$ (where, $0.05<d<0.25$ and X includes at least one selected from the group consisting of N, C, CN, NO, CO, and CNO); and a third cutting layer positioned on the second cutting layer and including $(Ti_eAl_{1-e})X$ (where, $0.3<e<0.7$ and X includes at least one selected from the group consisting of N, C, CN, NO, CO, and CNO).

In an embodiment, the cutting layer may have a structure formed in a plurality of layers in which the first cutting layer, the second cutting layer, and the third cutting layer are repeatedly laminated.

In an embodiment, the first cutting layer, the second cutting layer, and the third cutting layer may each have a thickness in a range of 1-100 nm.

In an embodiment, the cutting layer may have a total thickness in a range of 0.15-20 μm.

In an embodiment, the cutting layer may preferentially grow in a [200] direction and a ratio between a (200) peak and a (111) peak may be 3 to 10 in an X-ray diffraction analysis.

In an embodiment, the cutting layer may have a hardness in a range of 30-50 GPa.

In an embodiment, the cutting layer may have a columnar and polycrystalline alternate laminate structure and include a phase mixture of a cubic crystal phase and a hexagonal crystal phase.

In an embodiment, the multilayer coated cutting material may further include a coupling layer positioned between the base material and the cutting layer and configured to provide a coupling force with the base material.

In an embodiment, the coupling layer may include $(Ti_fSi_{1-f})X$ (where, $0.05<f<0.25$ and X includes at least one selected from the group consisting of N, C, CN, NO, CO, and CNO), $(Ti_gAl_{1-g})X$ (where, $0.3<g<0.7$ and X includes at least one selected from the group consisting of N, C, CN, NO, CO, and CNO), and a mixture thereof.

In an embodiment, the coupling layer may include: a first coupling layer including $(Ti_fSi_{1-f})X$ (where, $0.05<f<0.25$ and X includes at least one selected from the group consisting of N, C, CN, NO, CO, and CNO), $(Ti_gAl_{1-g})X$ (where, $0.3<g<0.7$ and X includes at least one selected from the group consisting of N, C, CN, NO, CO, and CNO), and a mixture thereof, and a second coupling layer positioned between the base material and the first coupling layer and including at least one selected from the group consisting of TiN, TiC, TiCN, TiNO, TiCO, TiCNO, TiAlN, TiAlC, TiAlCN, TiAlNO, TiAlCO and TiAlCNO.

In an embodiment, the first coupling layer and the second coupling layer may each be composed of a single layer or a composite layer in which at least two layers are laminated.

In an embodiment, the multilayer coated cutting material may further include a wear recognition layer positioned on the cutting layer.

In an embodiment, the wear recognition layer may include $(Ti_{1-h}Q_h)X$ (where, $0.05<h<0.3$, Q includes at least one selected from the group consisting of molybdenum (Mo), tungsten (W), niobium (Nb), vanadium (V), yttrium (Y), and zirconium (Zr), and X includes at least one selected from the group consisting of N, C, CN, NO, CO and CNO).

In accordance with another embodiment, a method for manufacturing a multilayer coated cutting material includes: providing a base material including a cemented carbide, cermet, ceramic, a cubic crystal boron nitride-based material or a hard alloy body of high-speed steel; forming a coupling layer on the base material; forming a cutting layer on the coupling layer; and forming a wear recognition layer on the cutting layer, wherein the cutting layer includes a first cutting layer positioned on the base material and including $(Ti_{1-a-b}Al_aM_b)X$ (where, $0.3<a<0.7$, $0<b<0.3$, M includes at least one selected from the group consisting of silicon (Si), zirconium (Zr), yttrium (Y), vanadium (V), niobium (Nb), molybdenum (Mo), and tungsten (W), and X includes at least one selected from the group consisting of N, C, CN, NO, CO, and CNO), a second cutting layer positioned on the first cutting layer and including $(Ti_dSi_{1-d})X$ (where, $0.05<d<0.25$ and X includes at least one selected from the group consisting of N, C, CN, NO, CO, and CNO), and a third cutting layer positioned on the second cutting layer and including $(Ti_eAl_{1-e})X$ (where, $0.3<e<0.7$ and X includes at least one selected from the group consisting of N, C, CN, NO, CO, and CNO).

In an embodiment, at least one among the forming of the coupling layer, the forming of the cutting layer, and the forming of the wear recognition layer may be performed in an atmosphere of argon and nitrogen at a gas pressure of 0.5-6.0 Pa, a bias of −10 V to −300 V, a temperature of 350-700° C., and a vaporization current of 50-200 A by using a physical vapor deposition method or a cathode arc deposition method.

In accordance with still another embodiment, a cutting tool insert for mechanical machining includes a multilayer coated cutting material, the multilayer coated cutting material including: a base material including a cemented carbide, cermet, ceramic, a cubic crystal boron nitride-based material or a hard alloy body of high-speed steel; and a cutting layer positioned on the base material and configured in multiple layers, wherein the cutting layer includes a first cutting layer positioned on the base material and including $(Ti_{1-a-b}Al_aM_b)X$ (where, $0.3<a<0.7$, $0<b<0.3$, M includes at least one selected from the group consisting of silicon (Si), zirconium (Zr), yttrium (Y), vanadium (V), niobium (Nb), molybdenum (Mo), and tungsten (W), and X includes at least one selected from the group consisting of N, C, CN, NO, CO, and CNO); a second cutting layer positioned on the first cutting layer and including $(Ti_dSi_{1-d})X$ (where, $0.05<d<0.25$ and X includes at least one selected from the group consisting of N, C, CN, NO, CO, and CNO); and a third cutting layer positioned on the second cutting layer and including $(Ti_eAl_{1-e})X$ (where, $0.3<e<0.7$ and X includes at least one selected from the group consisting of N, C, CN, NO, CO, and CNO).

BRIEF DESCRIPTION OF THE DRAWINGS

Embodiments can be understood in more detail from the following description taken in conjunction with the accompanying drawings, in which.

DETAILED DESCRIPTION

Hereinafter, embodiments will be described in detail with reference to the accompanying drawings. The embodiments of the present disclosure are provided so that those skilled in the art thoroughly understand the present disclosure, and the following embodiments may be embodied in many different forms and the scope of the present disclosure should not be construed as being limited to the embodiments set forth herein. Rather, these embodiments are provided so that this disclosure will be thorough and complete, and will fully convey the scope of the present disclosure to those skilled in the art. In the specification, like reference numerals refer to like elements throughout. Furthermore, various elements and regions in the drawings are schematically drawn. Accordingly, the technical concept of the present disclosure is not limited by relative sizes or intervals depicted in the accompanying drawings.

The technical idea of the present disclosure is to provide a multilayer coated cutting material and a cutting tool insert for mechanical machining which are for machining a hard-to-cut material such as a heat resistant alloy in which the heat conductivity of the alloy is low and a high temperature is caused during machining due to high reactivity with a tool.

Figure 1:
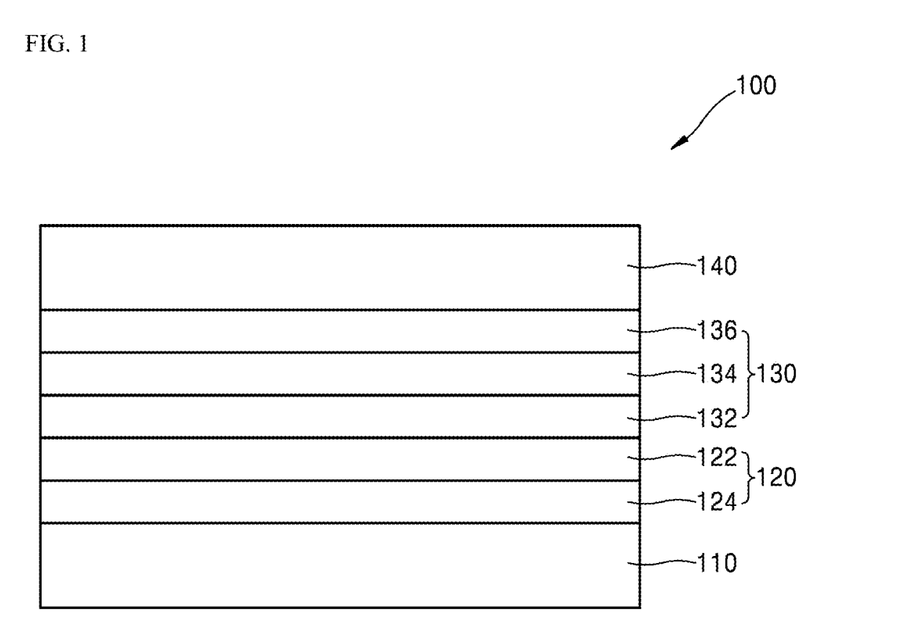
FIG. 1 is a cross-sectional view illustrating a multilayer coated cutting material in accordance with an embodiment.

FIG. 1 is a cross-sectional view illustrating a multilayer coated cutting material 100 in accordance with an embodiment.

Referring to FIG. 1, the multilayer coated cutting material 100 includes a base material 110, a coupling layer 120, a cutting layer 130, and a wear recognition layer 140.

The base material 110 may include a cemented carbide, cermet, ceramic, or cubic boron nitride-based material or a hard alloy body of high-speed steel.

The cutting layer 130 may be positioned on the base material 110 and composed of multiple layers. The cutting layer 130 may include a first cutting layer 132, a second cutting layer 134, and a third cutting layer 136. The cutting layer 130 may have a structure in which the first cutting layer 132, the second cutting layer 134 and the third cutting layer 136 are repeatedly laminated, for example, a structure composed of a plurality of layers which are laminated in the order of the first cutting layer 132, the second cutting layer 134, the third cutting layer 136, the first cutting layer 132, the second cutting layer 134 and the third cutting layer 136.

The first cutting layer 132 may be positioned on the base material 110 and include $(Ti_{1-a-b}Al_aM_b)X$. Here, the relationships $0.3<a<0.7$ and $0<b<0.3$ may be satisfied. The M may include at least one selected from the group consisting of silicon (Si), zirconium (Zr), vanadium (V), niobium (Nb), molybdenum (Mo), and tungsten (W). Materials constituting the M are illustrative and may include at least one metal element of group III, group IV, group V or group VI in the periodic table. The X may include at least one selected from the group consisting of N, C, CN, NO, CO and CNO.

For example, the first cutting layer 132 may be positioned on the base material 110 and include $(Ti_{1-a-b}Al_aM_b)CN$. Here, the relationships $0.3<a<0.7$ and $0<b<0.3$ may be satisfied. The M may include at least one selected from the group consisting of silicon (Si), zirconium (Zr), yttrium (Y), vanadium (V), niobium (Nb), molybdenum (Mo) and tungsten (W).

The second cutting layer 134 may be positioned on the first cutting layer 132 and include $(Ti_dSi_{1-d})X$. Here, the relationship $0.05<d<0.25$ may be satisfied. The X may include at least one selected from the group consisting of N, C, CN, NO, CO and CNO.

For example, the second cutting layer 134 may be positioned on the first cutting layer 132 and include $(Ti_dSi_{1-d})CN$. Here, the relationship $0.05<d<0.25$ may be satisfied.

The third cutting layer 136 may be positioned on the second cutting layer 134 and include $(Ti_eAl_{1-e})X$. Here, the relationship $0.3<e<0.7$ may be satisfied. The X may include at least one selected from the group consisting of N, C, CN, NO, CO and CNO.

For example, the third cutting layer 136 may be positioned on the second cutting layer 134 and include $(Ti_eAl_{1-e})CN$. Here, the relationship $0.3<e<0.7$ may be satisfied.

The first cutting layer 132, the second cutting layer 134, and the third cutting layer 136 may each have a thickness of the range of 1-100 nm, for example, a thickness of the range of 1-50 nm.

The total thickness of the cutting layer 130 may be in a range from 0.15 μm to 20 μm, for example, from 0.5 μm to 10 μm, from 0.5 μm to 5 μm, or from 1 μm to 5 μm. When the cutting layer 130 is formed as an alternate layer in which the first to third cutting layers 132, 134 and 146 are repeatedly formed, the total thickness of the cutting layer 130 may be required to be 0.5 μm or more, and may preferably have a total thickness of the range of 1.5-3 μm. Such the alternate layer may provide an effect of further improving the wear resistance of the cutting layer 130.

When the cutting layer 130 is less than, for example, 0.15 μm, particularly less than 1 μm, it is difficult for the cutting layer 130 to exhibit a characteristic as a thin film, and unless the cutting layer 130 is formed in an alternate layer of a certain level, it is difficult for the cutting layer to have stress generated while being formed by physical vapor deposition. When the cutting layer 130 exceeds 20 μm, for example, 8 μm, a self-induced peeling phenomenon may be caused due to excessive stress.

The cutting layer 130 may preferentially grow in the [200] direction. In addition, the ratio of the (200) peak and the (111) peak may be in a range of 3 to 10 in an X-ray diffraction analysis.

The cutting layer 130 may have a hardness of a range, for example, from 30 GPa to 50 GPa. Preferably, the cutting layer 130 may have a hardness exceeding 35 GPa or exceeding 38 GPa.

The cutting layer 130 may have a columnar and polycrystalline alternate laminate structure. The cutting layer 130 may include a phase mixture of a cubic crystal phase and a hexagonal crystal phase.

The coupling layer 120 is an optional element, and may be positioned between the base material 110 and the cutting layer 130 to provide a coupling force with the base material 110.

The coupling layer 120 may have a thickness of the range of, for example, 0.3-2 μm, and may have a total thickness of the range of 0.3-1.5 μm. When the coupling layer 120 is less than 0.3 μm, it may be difficult to provide coupling force. When the coupling layer 120 exceeds 2 μm, the effect of increasing coupling force may decrease, a peeling phenomenon may rather be caused, and the effect of improving wear resistance may be decreased.

The coupling layer 120 may include $(Ti_fSi_{1-f})X$, $(Ti_gAl_{1-g})X$, and a mixture thereof. Here, the relationships $0.05<f<0.25$ and $0.3<g<0.7$ may be satisfied. The X may include at least one selected from the group consisting of N, C, CN, NO, CO and CNO.

For example, the coupling layer 120 may include $(Ti_fSi_{1-f})CN$, $(Ti_gAl_{1-g})CN$ and a mixture thereof. Here, the relationships $0.05<f<0.25$ and $0.3<g<0.7$ may be satisfied.

Alternatively, the coupling layer 120 may include a first coupling layer 122 and a second coupling layer 124. In such a case, the coupling layer 122 may include $(Ti_fSi_{1-f})X$, $(Ti_gAl_{1-g})X$, and a mixture thereof. Here, the relationships $0.05<f<0.25$ and $0.3<g<0.7$ may be satisfied. The X may include at least one selected from the group consisting of N, C, CN, NO, CO and CNO. For example, the first coupling layer 122 may include $(Ti_fSi_{1-f})CN$, $(Ti_gAl_{1-g})CN$ and a mixture thereof. Here, the relationships $0.05<f<0.25$ and $0.3<g<0.7$ may be satisfied.

The second coupling layer 124 may be positioned between the base material 110 and the first coupling layer 122, and include at least one selected from the group consisting of TiN, TiC, TiCN, TiNO, TiCO, TiCNO, TiAlN, TiAlC, TiAlCN, TiAlNO, TiAlCO, and TiAlCNO. The first coupling layer 122 and the second coupling layer 124 may each be configured as a single layer or as a composite layer in which at least two layers are laminated. Preferably, the first coupling layer 122 and the second coupling layer 124 may each be configured as a single layer.

The wear recognition layer 140 is an optional element, and may be positioned on the cutting layer 130 and help a user to easily recognize the degree of wear of the cutting layer 130.

The wear recognition layer 140 may include $(Ti_{1-h}Q_h)X$. Here, the relationship $0.05<h<0.3$ may be satisfied. The Q may include at least one selected from the group consisting of molybdenum (Mo), tungsten (W), niobium (Nb), vanadium (V), yttrium (Y), and zirconium (Zr). The X may include at least one selected from the group consisting of N, C, CN, NO, CO and CNO.

For example, the wear recognition layer 140 may include $(Ti_{1-h}Q_h)CN$. Here, the relationship $0.05<h<0.3$ may be satisfied. The Q may include at least one selected from the group consisting of molybdenum (Mo), tungsten (W), niobium (Nb), vanadium (V), yttrium (Y), and zirconium (Zr).

In order for a user to easily recognize wear, it is desirable that the content of titanium (Ti) in the wear recognition layer 140 be at least 50%. Only when the titanium (Ti) content is high, a deviation in color between the wear recognition layer 140 and a material which is present below the wear recognition layer 140, for example, the cutting layer 130 or the base material 110 and the wear recognition layer 140 becomes high, and therefore an effect of recognizing wear may be increased. In addition, when the wear recognition layer 140 includes a carbonitrides and molybdenum (Mo), the lubrication property of the wear recognition layer 140 is enhanced and thus the weld resistance is improved, heat is easily transferred via chips when a workpiece is machined, and weld between a cutting material and the workpiece is prevented, and thus, wear resistance of the cutting material may be increased.

The wear recognition layer 140 may be configured as a single layer or as a composite layer in which at least two layers are laminated. Preferably, the wear recognition layer 140 may be configured as a single layer.

The wear recognition layer 130 may have a thickness of the range of, for example, 0.3-2 μm, and may have a total thickness of the range of 0.3-1.5 μm.

Figure 2:
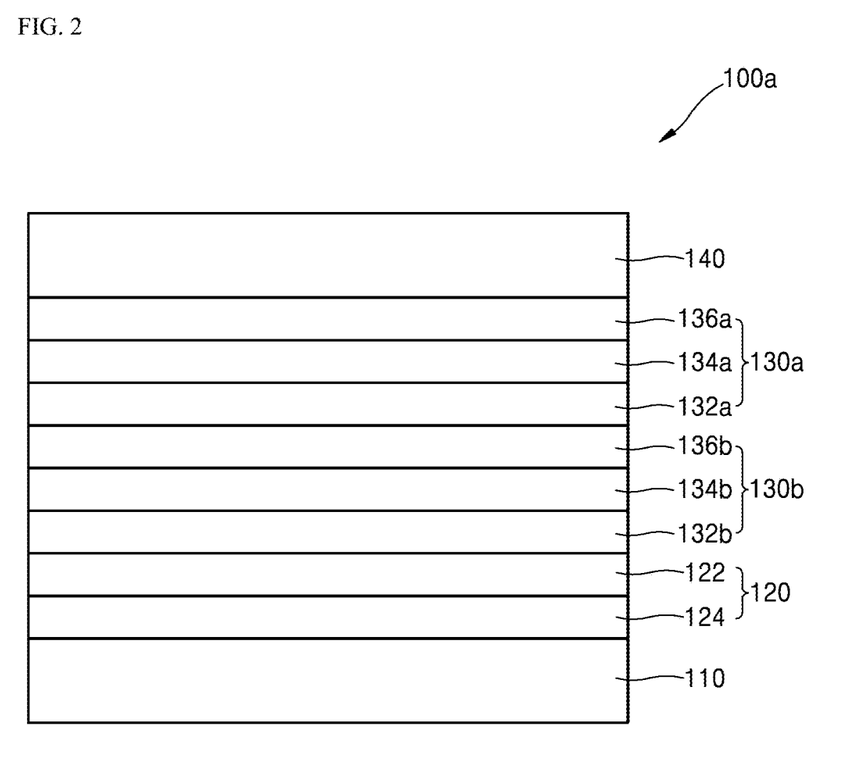
FIG. 2 is a cross-sectional view illustrating a multilayer coated cutting material in accordance with an embodiment.

FIG. 2 is a cross-sectional view illustrating a multilayer coated cutting material 100a in accordance with an embodiment. In this embodiment, descriptions on the components overlapping those in the embodiment described with reference to FIG. 1 will be omitted.

Referring to FIG. 2, a multilayer coated cutting material 100a includes a base material 110, a coupling layer 120, cutting layers 130a and 130b, and a wear recognition layer 140. The cutting layers 130a and 130b may include an upper cutting layer 130a and a lower cutting layer 130b. That is, the cutting layers 130a and 130b are configured by including: an upper cutting layer 130a constituted by a first upper cutting layer 132a, a second upper cutting layer 134a, and a third upper cutting layer 136a; and a lower cutting layer 130b constituted by a first lower cutting layer 132b, a second lower cutting layer 134b and a third lower cutting layer 136b.

The first upper cutting layer 132a and the first lower cutting layer 132b may have the same configuration as the first cutting layer 132 of FIG. 1. The second upper cutting layer 134a and the second lower cutting layer 134b may have the same configuration as the second cutting layer 134 of FIG. 1. The third upper cutting layer 136a and the third lower cutting layer 136b may have the same configuration as the third cutting layer 136 of FIG. 1.

That is, the multilayer coated cutting material 100a of FIG. 2 may have a cutting layer in which the first cutting layer 132, the second cutting layer 134 and the third cutting layer 136 are repeatedly and alternately laminated. In addition, while FIG. 2 shows that two layers are laminated as the cutting layers 130a and 130b, this is illustrative, and even a case in which a plurality of layers of two or more layers are laminated to form a cutting layer, is included in the technical idea of the present disclosure.

Figure 3:
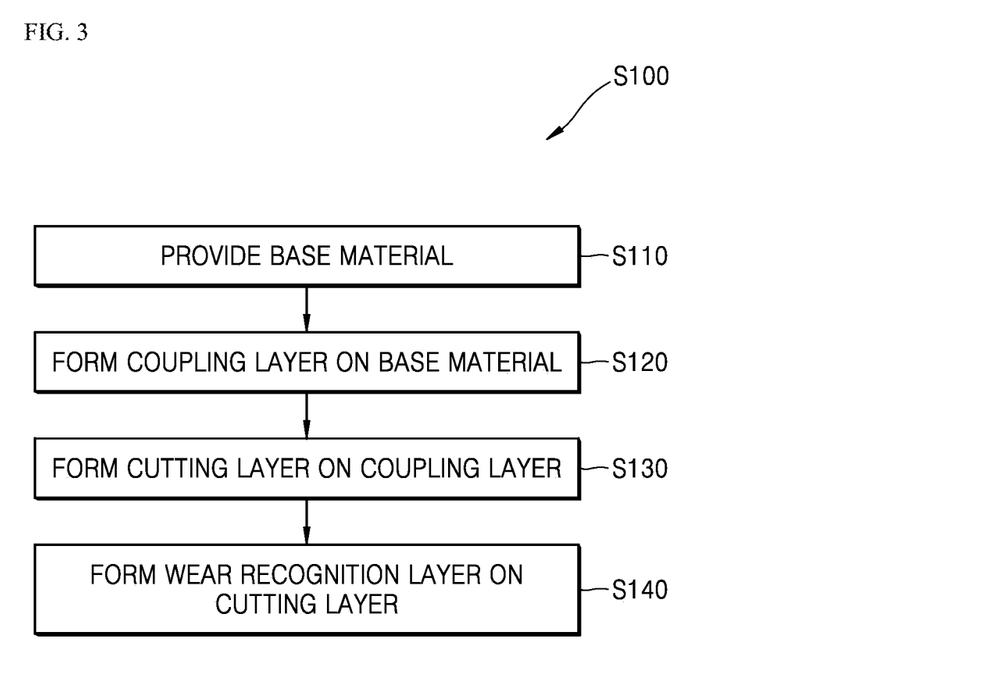
FIG. 3 is a flowchart illustrating a method for manufacturing a multilayer coated cutting material in accordance with an embodiment.

FIG. 3 is a flowchart illustrating a manufacturing method S100 for a multilayer coated cutting material in accordance with an embodiment.

Referring to FIG. 3, the manufacturing method S100 for a multilayer coated cutting material includes: providing a base material (S110); forming a coupling layer on the base material (S120); forming a cutting layer on the coupling layer (S130); and forming a wear recognition layer on the cutting layer (S140).

The cutting layer may include: a first cutting layer which is positioned on the base material and includes $(Ti_{1-a-b}Al_aM_b)X$ (where, $0.3<a<0.7$, $0<b<0.3$, M includes at least one selected from the group consisting of silicon (Si), zirconium (Zr), yttrium (Y), vanadium (V), niobium (Nb), molybdenum (Mo), and tungsten (W), and X includes at least one selected from the group consisting of N, C, CN, NO, CO, and CNO); a second cutting layer which is positioned on the first cutting layer and includes $(Ti_dSi_{1-d})X$ (where, $0.05<d<0.25$, and X includes at least one selected from the group consisting of N, C, CN, NO, CO and CNO); and a third cutting layer which is positioned on the second cutting layer and includes $(Ti_eAl_{1-e})X$ (where, $0.3<e<0.7$, and X includes at least one selected from the group consisting of N, C, CN, NO, CO and CNO.

For example, the cutting layer may include: a first cutting layer which is positioned on the base material and includes $(Ti_{1-a-b}Al_aM_b)CN$ (where, $0.3<a<0.7$, $0<b<0.3$, and M includes at least one selected from the group consisting of silicon (Si), zirconium (Zr), yttrium (Y), vanadium (V), niobium (Nb), molybdenum (Mo), and tungsten (W)); a second cutting layer which is positioned on the first cutting layer and includes $(Ti_dSi_{1-d})CN$ (where, $0.05<d<0.25$); and a third cutting layer which is positioned on the second cutting layer and includes $(Ti_eAl_{1-e})CN$ (where, $0.3<e<0.7$).

At least one among the forming of the coupling layer (S120), the forming of the cutting layer (S130), and the forming of the wear recognition layer (S140) may be performed by using a physical vapor deposition method or a cathodic arc deposition method.

At least one among the forming of the coupling layer (S120), the forming of the cutting layer (S130), and the forming of the wear recognition layer (S140) may be performed in an atmosphere of argon and nitrogen at a gas pressure of 0.5-6.0 Pa, a bias of −10 V to −300 V, a temperature of 350-700° C., and a vaporization current of 50-200 A.

Optionally, after performing the forming of the recognition layer on the cutting layer (S140), required surface treatment may further be performed.

Figure 4:
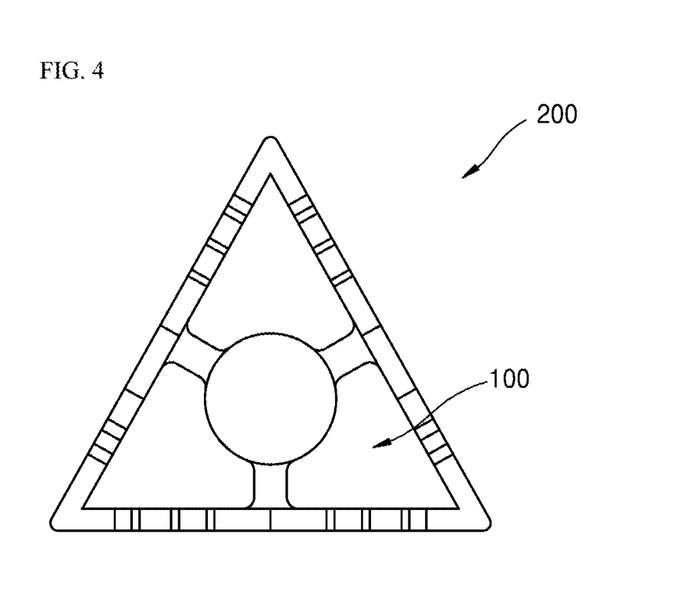
FIG. 4 is a schematic view illustrating a cutting tool insert for mechanical machining in accordance with an embodiment.

FIG. 4 is a schematic view illustrating a cutting tool insert 200 for mechanical machining in accordance with an embodiment.

Referring to FIG. 4, the cutting tool insert 200 for mechanical machining includes a multilayer coated cutting material 100.

As described above, the multilayer coated cutting material 100 may include the base material; and a cutting layer which is positioned on the base material and configured as a multilayer. The cutting layer may include: a first cutting layer which is positioned on the base material and includes $(Ti_{1-a-b}Al_aM_b)X$ (where, $0.3<a<0.7$, $0<b<0.3$, M includes at least one selected from the group consisting of silicon (Si), zirconium (Zr), yttrium (Y), vanadium (V), niobium (Nb), molybdenum (Mo), and tungsten (W), and X includes at least one selected from the group consisting of N, C, CN, NO, CO, and CNO); a second cutting layer which is positioned on the first cutting layer and includes $(Ti_dSi_{1-d})X$ (where, 0.05<d<0.25 and X includes at least one selected from the group consisting of N, C, CN, NO, CO, and CNO); and a third cutting layer which is positioned on the second cutting layer and includes $(Ti_eAl_{1-e})X$ (where, 0.3<e<0.7 and X includes at least one selected from the group consisting of N, C, CN, NO, CO, and CNO).

For example, as described above, the multilayer coated cutting material 100 may include a base material; and a cutting layer which is positioned on the base material and configured as a multilayer. For example, the cutting layer may include: a first cutting layer which is positioned on the base material and includes $(Ti_{1-a-b}Al_aM_b)CN$ (where, 0.3<a<0.7, 0<b<0.3, and M includes at least one selected from the group consisting of silicon (Si), zirconium (Zr), yttrium (Y), vanadium (V), niobium (Nb), molybdenum (Mo), and tungsten (W); a second cutting layer which is positioned on the first cutting layer and includes $(Ti_dSi_{1-d})CN$ (where, 0.05<d<0.25); and a third cutting layer which is positioned on the second cutting layer and includes $(Ti_eAl_{1-e})CN$ (where, 0.3<e<0.7).

Experimental Example

Hereinafter, experimental examples are provided to help understand the present disclosure. However, the experimental examples below are illustrated merely to help understand the present disclosure, and the present disclosure is not limited by the experimental examples below.

Manufacturing of Insert Coated with Multilayer Coated Cutting Material

A multilayer coated cutting material having the composition of Table 1 was formed on an insert.

Table 1 shows the compositions of the multiple layers coated cutting materials formed on the inserts of examples and comparative examples of the present disclosure.

Multilayer coated cutting layers each including a coupling layer, a cutting layer, and a wear recognition layer are respectively formed on the inserts serving as the base materials by using an arc ion plating method, which is one of physical vapor deposition (PVD) methods.

For the base material, a cemented carbide (94 wt % WC+6 wt % Co) having the product number of CNMG120408-SM was used. Before forming the multilayer coated cutting layers, a surface of each of the base materials was smoothened by performing dry and wet blasting in order to remove foreign substances and improve the adhesiveness of a thin film on the surface of each of the base materials.

Subsequently, the base material was loaded into a chamber, and an ion bombardment treatment was performed in an argon atmosphere in order to further clean the surface.

Subsequently, an arc target composed of AlTiSi, AlTi, TiSi, and the like was used and an arc ion plating method were used to form a multilayer coated cutting layer. In the forming of the multilayer coated cutting layer, an initial vacuum pressure was no greater than $5.0 \times 10^{-2}$ Pa, a gas atmosphere was formed by injecting $C_2H_2$ and $N_2$ as reaction gases, and the deposition temperature was set to the range of 450-600° C. When forming the cutting layer, an arc current of 100-200 A was applied to a main target and a DC bias voltage of −30 V to −150 V was applied in order to raise the degree of close contact with the base material. The average thickness of each of the layers included in the multilayer coated cutting layer may be controlled by changing the cathode arc current and the rotation speed (0.1-5 rpm) of equipment. The total thickness of the multilayer coated cutting layer was formed in the range of, for example, 1-5 m, and the thickness of each layer was formed in a thickness capable of performing a certain function.

After forming the multilayer coated cutting layer, a surface treatment was performed. The surface treatment may be

TABLE 1

| | Cutting layer | | | Cutting | Coupling layer | | Coupling |
|---|---|---|---|---|---|---|---|
| | First cutting layer | Second cutting layer | Third cutting layer | layer thickness (μm) | First coupling layer | Second coupling layer | layer thickness (μm) |
| Example 1 | TiAlSiCN (30:60:10) | TiSiCN (85:15) | TiAlCN (33:67) | 2 | TiAlN (33:67) | TiSiN (85:15) | 1 |
| Example 2 | TiAlSiCN (30:60:10) | TiSiCN (85:15) | TiAlCN (33:67) | 3 | TiAlN (33:67) | TiSiN (85:15) | 1 |
| Example 3 | TiAlSiCN (30:60:10) | TiSiCN (80:20) | TiAlCN (33:67) | 2 | TiAlN (33:67) | TiSiN (80:20) | 1 |
| Example 4 | TiAlSiCN (30:60:10) | TiSiCN (80:20) | TiAlCN (33:67) | 3 | TiAlN (33:67) | TiSiN (80:20) | 1 |
| Comparative example 1 | TiAlN (50:50) | | | 3 | | | |
| Comparative example 2 | TiAlN (33:67) | | | 3 | | | |
| Comparative example 3 | TiAlN (60:40) | TiN (100) | | 3 | | | |
| Comparative example 4 | TiAlSiN (30:60:10) | | | | | | |
| Comparative example 5 | TiSiN (80:20) | | | 2 | TiAlN (50:50) | | 1 |
| Comparative example 6 | TiAlN (50:50) | TiSiN (85:15) | | 2 | TiAlN (50:50) | TiN (100) | 1.5 |

In Table 1, the composition content shows the at % of each of components based on the total 100 of the remaining components excluding C and/or N which are non-metal components. For example, it is shown that TiAlSiCN includes 30 at % of Ti, 60 at % of Al, and 10 at % of Si. It is noted that carbon (C) and nitrogen (N) are not shown.

performed by using a method using dry and wet blasting or a polishing machine. In some cases, the surface treatment may be performed by borrowing a method in which various methods are combined. In this experimental example, a wet blasting method was performed as the surface treatment. When performing the wet blasting treatment, alumina (Al$_2$O$_3$) having a size in the range of 10-400 μm and a polishing agent that can be added to the alumina were used as the materials of blasting particles. In addition, a pressure in the range of 1.0-4.0 bar was applied, and droplets on the blade tip surface and protruding portions were removed, thereby the surface treatment was completed.

When the residual stress in the multilayer coated cutting layer is high, a peeling phenomenon of edge flaking may occur in the blade tip portion of the insert, and therefore it is necessary to confirm the state of the blade tip portion in order to prevent the phenomenon.

An X-ray diffraction measurement was performed on the multilayer coated cutting layer by using an X-ray diffraction device Empyrean made by Panalytical.

Figure 5:
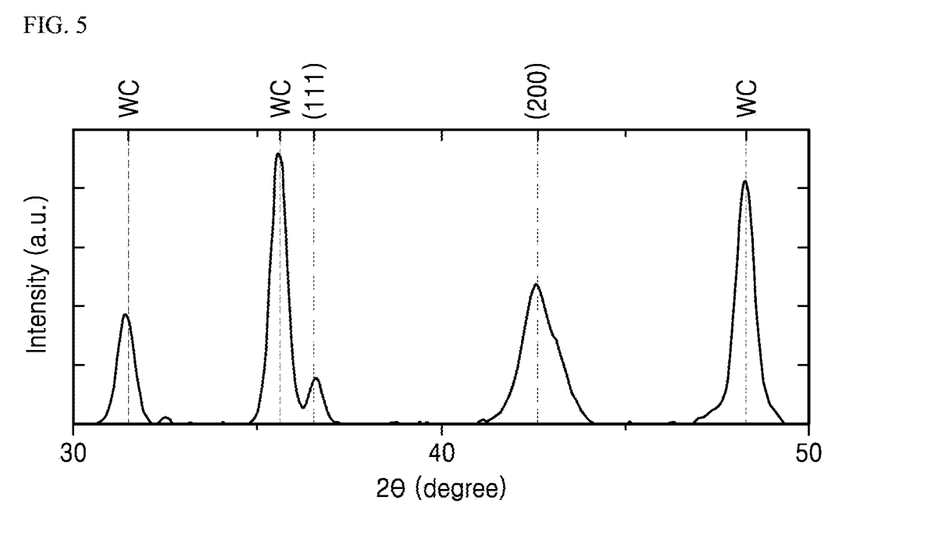
FIG. 5 is a graph illustrating an X-ray diffraction pattern of a multilayer coated cutting material in accordance with an embodiment.

FIG. 5 is a graph illustrating an X-ray diffraction pattern of a multilayer coated cutting material in accordance with an embodiment.

Referring to FIG. 5, peaks corresponding to tungsten carbide (WC) of the base material are shown in the multilayer coated cutting material. In addition, a (200) peak and a (111) peak are shown. The peak strength of the (200) plane of the multilayer coated cutting layer was the highest, and thus, it may be found that the cutting layer preferentially grew in the [200] direction. In addition, the ratio between the (200) peak and the (111) peak may be 3 or higher, for example, in a range of 3 to 10. The multilayer coated cutting layer may have an alternate laminate structure and include a phase mixture of a cubic crystal phase and a hexagonal crystal phase.

In addition, the hardness of the multilayer coated cutting layer was measured by using an NHT3 Nano-indentor (Anton Paar Co.). The multilayer coated cutting layer may have a hardness of the range of 30-50 GPa and thus may ensure wear resistance of a desired level. The multilayer coated cutting layer may have a micro hardness of 30 GPa or higher, and preferably of greater than 35 GPa.

Figure 6:
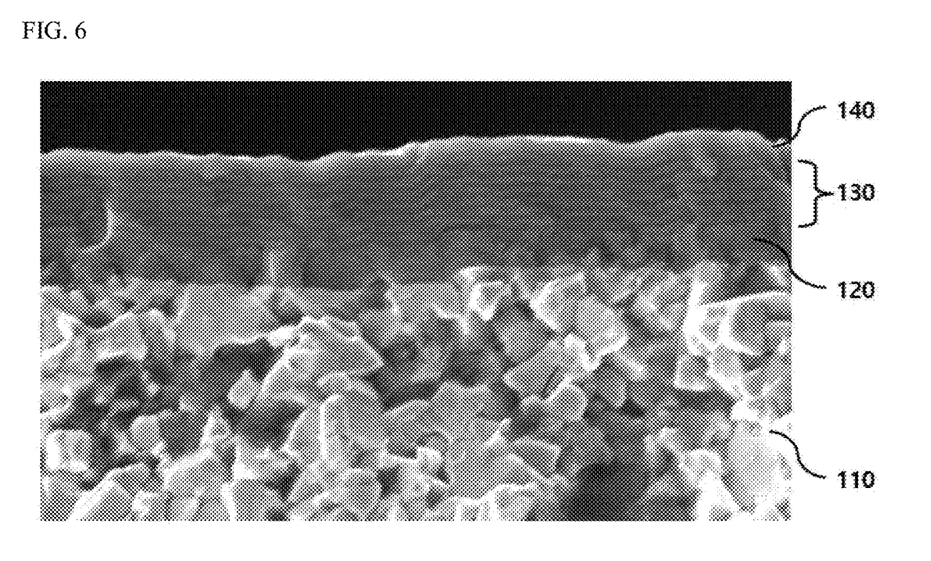
FIG. 6 is a scanning electron microscopic photograph illustrating a cross-section of a multilayer coated cutting material in accordance with an embodiment.

FIG. 6 is a scanning electron microscopic photograph illustrating a cross-section of a multilayer coated cutting material in accordance with an embodiment.

Referring to FIG. 6, a plurality of laminated layers, for example, a coupling layer 120, a cutting layer 130, and a wear recognition layer 140 are formed on a base material 110. From the result of confirming the growth direction of the layers through a scanning electron microscopic analysis, it may be found that the cutting layer 130 has a columnar structure and a cubic crystal phase and a hexagonal crystal phase are mixed and grow. Accordingly, it has been confirmed that the cutting layer 130 has a columnar and polycrystalline alternate laminate structure.

Measurement of Lifespan of Insert Coated with Multilayer Coated Cutting Material First Test: Lifespan Measurement Examples and comparative examples of inserts coated with the above-described multilayer coated cutting layers were tested in the following conditions and a first test was performed, thereby measuring the lifespan in Inconel 718.
(1) Shape: CNMG120408-SM
(2) Application fields: CNC machining, lengthwise turning, and general machining
(3) Workpiece material: Inconel 718
(4) Cutting speed: 50 m/min
(5) Feed speed: 0.15 mm/rev
(6) Depth of cut: 1.0 mm
(7) Cutting oil: supply water soluble oil from outside
(8) Lifespan determining reference: flank wear ($V_b$)>0.3 mm or notch wear ($V_n$)>0.45 mm Second Test: Lifespan Measurement Examples and comparative examples of inserts coated with the above-described multilayer coated cutting layers were tested in the following conditions and a second test was performed, thereby measuring the lifespan in Inconel 718.
(1) Shape: CNMG120408-SM
(2) Application fields: CNC machining, lengthwise turning, and general machining
(3) Workpiece material: Inconel 718
(4) Cutting speed: 70 m/min
(5) Feed speed: 0.2 mm/rev
(6) Depth of cut: 1.5 mm
(7) Cutting oil: supply water soluble oil from outside
(8) Lifespan determining reference: flank wear ($V_b$)>0.3 mm or notch wear ($V_n$)>0.45 mm Table 2 shows the lifespans measured in the first test and the second test on the examples and the comparative examples of the present disclosure.

TABLE 2

|  | First test measurement lifespan (minutes) | Second test measurement lifespan (minutes) |
| --- | --- | --- |
| Example 1 | 15 | 10 |
| Example 2 | 24 | 16 |
| Example 3 | 12 | 5 |
| Example 4 | 14 | 10.5 |
| Comparative example 1 | 7 | 1 |
| Comparative example 2 | 9 | 3 |
| Comparative example 3 | 6 | 2 |
| Comparative example 4 | 9 | 0 |
| Comparative example 5 | 10 | 5 |
| Comparative example 6 | 9 | 6 |

Referring to Table 2, it may be found that the lifespans of the examples are longer than the lifespans of the comparative examples both in the first test and the second test. Specifically, in the first test, the examples have lifespans longer than 10 minutes, whereas the comparative examples have lifespans of 10 minutes or shorter. In the second test, the examples have lifespans of 10 minutes or longer, whereas the comparative examples have lifespans of shorter than 10 minutes or 6 minutes or shorter.

Third Test: Wear Measurement

Examples and comparative examples of inserts coated with the above-described multilayer coated cutting layers were tested in the following conditions and a third test was performed, thereby measuring the wear in Inconel 718.
(1) Shape: CNMG120408-SR
(2) Application fields: CNC machining, lengthwise turning, and semi-rough machining
(3) Workpiece material: Inconel 718
(4) Cutting speed: 60 m/min
(5) Feed speed: 0.2 mm/rev
(6) Depth of cut: 2.0 mm
(7) Cutting oil: supply water soluble oil from outside
(8) Lifespan determining reference: flank wear ($V_b$)>0.3 mm or notch wear ($V_n$)>0.45 mm Table 3 shows flank wear ($V_b$) and notch wear (Vn) on the examples and the comparative examples of the present disclosure.

TABLE 3

| After 6-minute cutting | Flank wear ($V_b$) | Notch wear ($V_n$) |
|---|---|---|
| Example 2 | 0.021 mm | 0.028 mm |
| Example 4 | 0.026 mm | 0.035 mm |
| Comparative example 5 | 0.045 mm | 0.060 mm |

Referring to Table 3, it was found that the flank wear ($V_b$) and notch wear ($V_n$) were smaller in example 2 and example 4 than in comparative example 5. In particular, the flank wear and the notch wear were found to be the smallest in example 2. Accordingly, it may be predicted that the lifespans in examples 2 and 4 are longer than that in comparative example 5.

Fourth Test: Lifespan Measurement

Examples and comparative examples of inserts coated with the above-described multilayer coated cutting layers were tested in the following conditions and a fourth test was performed, thereby measuring the lifespan in SUS630.
(1) Shape: CNMG120408-SM
(2) Application fields: CNC machining, lengthwise turning, and general machining
(3) Workpiece material: SUS630
(4) Cutting speed: 170 m/min
(5) Feed speed: 0.2 mm/rev
(6) Depth of cut: 2.0 mm
(7) Cutting oil: supply water soluble oil from outside
(8) Lifespan determining reference: flank wear ($V_b$)>0.3 mm or notch wear ($V_n$)>0.45 mm Fifth Test: Lifespan Measurement Examples and comparative examples of inserts coated with the above-described multilayer coated cutting layers were tested in the following conditions and a fourth test was performed, thereby measuring the lifespan in SUS304.
(1) Shape: CNMG120408-SM
(2) Application fields: CNC machining, lengthwise turning, and general machining
(3) Workpiece material: SUS304(4) Cutting speed: 230 m/min
(5) Feed speed: 0.2 mm/rev
(6) Depth of cut: 2.0 mm
(7) Cutting oil: supply water soluble oil from outside
(8) Lifespan determining reference: flank wear ($V_b$)>0.3 mm or notch wear ($V_n$)>0.45 mm For reference, when the flank wear was 0.3 mm or more, the lifespan was determined to be terminated.

Table 4 shows the tool lifespans measured in the fourth test and the fifth test on the examples and the comparative examples of the present disclosure.

TABLE 4

| | Fourth test (SUS630) Lifespan (cuttable time) | Fifth test (SUS304) Lifespan (cuttable time) |
|---|---|---|
| Example 2 | 24 minutes | 20 minutes |
| Example 4 | 21 minutes | 15 minutes |
| Comparative example 5 | 18 minutes | 12 minutes |

Referring to Table 4, the lifespans (cuttable time) were shown to be longer in examples 2 and 4 than in comparative example 5. As such, when examining the test results of first to fifth tests, it may be found that in examples according to technical idea of the present disclosure, lifespans are increased due to enhancement in wear resistance and heat resistance in machining hard-to-cut materials such as heat resistant alloys.

According to the technical idea of the present disclosure, in a multilayer coated cutting material having increased wear resistance at high temperatures, an alternate layer of (Ti, Si)C,N, (Ti, Al)C,N, (Ti, Al, Si)C,N is formed on a cutting tool insert as a repeatedly laminated-type coating structure, thereby suppressing the propagation of a crack, and a thin film acquires high hardness by controlling a difference in the lattice constants and a difference in the elastic moduli between alternate layers having such small thicknesses, and thus, improved heat resistance and wear resistance of craters, flanks, and notches, toughness and strength and the like may be obtained. In addition, when an alloy composition is added to each of some alternate layers, the lifespan of the tool may remarkably improved compared to that in the existing art during a mechanical machining work in which the temperature of the tool becomes high as in a heat resistant alloy.

A cutting tool, to which the multilayer coated cutting material is applied, may be useful in a turning work of stainless steel and heat resistant alloys in a wet condition, and may provide an improvement in the stability and machinability of cutting blades in a metal cutting field in which high temperatures are generated, for example, during mechanical machining of heat resistant alloys and hardened steels.

The above-mentioned effects of the present disclosure are exemplarily described, and the scope of the present disclosure is not limited by the effects.

The present disclosure described so far is not limited to the abovementioned embodiments and the accompanying drawings, it would be obvious to those skilled in the art that various replacements, modifications, and changes can be made therein without departing from the spirit and scope of the following claims.

What is claimed is:

1. A multilayer coated cutting material comprising:
a base material comprising a cemented carbide, cermet, ceramic, a cubic crystal boron nitride-based material or a hard alloy body of high-speed steel; and
a cutting layer positioned on the base material and configured in multiple layers,
wherein the cutting layer comprises:
a first cutting layer positioned on the base material and comprising $(Ti_{1-a-b}Al_aM_b)X$ (where, 0.3<a<0.7, 0<b<0.3, M comprises at least one selected from the group consisting of silicon (Si), zirconium (Zr), yttrium (Y), vanadium (V), niobium (Nb), molybdenum (Mo), and tungsten (W), and X comprises at least one selected from the group consisting of N, C, CN, NO, CO, and CNO);
a second cutting layer positioned on the first cutting layer and comprising $(Ti_dSi_{1-d})X$ (where, 0.05<d<0.25 and X comprises at least one selected from the group consisting of N, C, CN, NO, CO, and CNO); and
a third cutting layer positioned on the second cutting layer and comprising $(Ti_eAl_{1-e})X$ (where, 0.3<e<0.7 and X comprises at least one selected from the group consisting of N, C, CN, NO, CO, and CNO).

2. The multilayer coated cutting material of claim 1, wherein the cutting layer comprises a structure formed in a plurality of layers in which the first cutting layer, the second cutting layer, and the third cutting layer are repeatedly laminated.

3. The multilayer coated cutting material of claim 1, wherein the first cutting layer, the second cutting layer, and the third cutting layer each have a thickness in a range of 1 nm to 100 nm.

4. The multilayer coated cutting material of claim 1, wherein the cutting layer has a total thickness of 0.15 μm to 20 μm.

5. The multilayer coated cutting material of claim 1, wherein the cutting layer preferentially grows in a [200] direction and a ratio between a (200) peak and a (111) peak is 3 to 10 in an X-ray diffraction analysis.

6. The multilayer coated cutting material of claim 1, wherein the cutting layer has a hardness in a range of 30 GPa to 50 GPa.

7. The multilayer coated cutting material of claim 1, wherein the cutting layer has a columnar and polycrystalline alternate laminate structure and comprises a phase mixture of a cubic crystal phase and a hexagonal crystal phase.

8. The multilayer coated cutting material of claim 1, further comprising a coupling layer positioned between the base material and the cutting layer and configured to provide a coupling force with the base material.

9. The multilayer coated cutting material of claim 8, wherein the coupling layer comprises $(Ti_fSi_{1-f})X$ (where, $0.05<f<0.25$ and X comprises at least one selected from the group consisting of N, C, CN, NO, CO, and CNO), $(Ti_gAl_{1-g})X$ (where, $0.3<g<0.7$ and X comprises at least one selected from the group consisting of N, C, CN, NO, CO, and CNO), and a mixture thereof.

10. The multilayer coated cutting material of claim 8, wherein the coupling layer comprises:
 a first coupling layer comprising $(Ti_fSi_{1-f})X$ (where, $0.05<f<0.25$ and X comprises at least one selected from the group consisting of N, C, CN, NO, CO, and CNO) and $(Ti_gAl_{1-g})X$ (where, $0.3<g<0.7$ and X comprises at least one selected from the group consisting of N, C, CN, NO, CO, and CNO), and a mixture thereof; and
 a second coupling layer positioned between the base material and the first coupling layer, and comprising at least one selected from the group consisting of TiN, TiC, TiCN, TiNO, TiCO, TiCNO, TiAlN, TiAlC, TiAlCN, TiAlNO, TiAlCO, and TiAlCNO.

11. The multilayer coated cutting material of claim 10, wherein the first coupling layer and the second coupling layer each are composed of a single layer or a composite layer in which at least two layers are laminated.

12. The multilayer coated cutting material of claim 1, further comprising a wear recognition layer positioned on the cutting layer.

13. The multilayer coated cutting material of claim 12, wherein the wear recognition layer comprises $(Ti_{1-h}Q_h)X$ (where, $0.05<h<0.3$, Q comprises at least one selected from the group consisting of molybdenum (Mo), tungsten (W), niobium (Nb), vanadium (V), yttrium (Y), and zirconium (Zr), and X comprises at least one selected from the group consisting of N, C, CN, NO, CO and CNO).

14. A method for manufacturing a multilayer coated cutting material, the method comprising:
 providing a base material, the base material including a cemented carbide, cermet, ceramic, a cubic crystal boron nitride-based material or a hard alloy body of high-speed steel;
 forming a coupling layer on the base material;
 forming a cutting layer on the coupling layer; and
 forming a wear recognition layer on the cutting layer,
 wherein the cutting layer comprises:
 a first cutting layer positioned on the base material and comprising $(Ti_{1-a-b}Al_aM_b)X$ (where, $0.3<a<0.7$, $0<b<0.3$, M comprises at least one selected from the group consisting of silicon (Si), zirconium (Zr), yttrium (Y), vanadium (V), niobium (Nb), molybdenum (Mo), and tungsten (W), and X comprises at least one selected from the group consisting of N, C, CN, NO, CO, and CNO);
 a second cutting layer positioned on the first cutting layer and comprising $(Ti_dSi_{1-d})X$ (where, $0.05<d<0.25$ and X comprises at least one selected from the group consisting of N, C, CN, NO, CO, and CNO); and
 a third cutting layer positioned on the second cutting layer and comprising $(Ti_eAl_{1-e})X$ (where, $0.3<e<0.7$ and X comprises at least one selected from the group consisting of N, C, CN, NO, CO, and CNO).

15. The method of claim 14, wherein:
 at least one among the forming of the coupling layer, the forming of the cutting layer, and the forming of the recognition layer is performed by using a physical vapor deposition method or a cathode arc deposition method; and
 at least one among the forming of the coupling layer, the forming of the cutting layer, and the forming of the wear recognition layer is performed in an argon and nitrogen atmosphere at a gas pressure of 0.5 Pa to 6.0 Pa, a bias of −10 V to −300 V, a temperature of 350° C. to 700° C., and a vaporization current of 50 A to 200 A.

16. A cutting tool insert for mechanical machining comprising a multilayer coated cutting material, the multilayer coated cutting material comprising:
 a base material comprising a cemented carbide, cermet, ceramic, a cubic crystal boron nitride-based material or a hard alloy body of high-speed steel; and
 a cutting layer positioned on the base material and configured in multiple layers,
 wherein the cutting layer comprises:
 a first cutting layer positioned on the base material and comprising $(Ti_{1-a-b}Al_aM_b)X$ (where, $0.3<a<0.7$, $0<b<0.3$, M comprises at least one selected from the group consisting of silicon (Si), zirconium (Zr), yttrium (Y), vanadium (V), niobium (Nb), molybdenum (Mo), and tungsten (W), and X comprises at least one selected from the group consisting of N, C, CN, NO, CO, and CNO);
 a second cutting layer positioned on the first cutting layer and comprising $(Ti_dSi_{1-d})X$ (where, $0.05<d<0.25$ and X comprises at least one selected from the group consisting of N, C, CN, NO, CO, and CNO); and
 a third cutting layer positioned on the second cutting layer and comprising $(Ti_eAl_{1-e})X$ (where, $0.3<e<0.7$ and X comprises at least one selected from the group consisting of N, C, CN, NO, CO, and CNO).

* * * * *